United States Patent [19]
Parham

[11] Patent Number: 5,731,745
[45] Date of Patent: Mar. 24, 1998

[54] HIGH FREQUENCY OSCILLATOR CIRCUITS OPERABLE AS FREQUENCY MODULATORS AND DEMODULATORS

[75] Inventor: O. D. Parham, La Habra, Calif.

[73] Assignee: PSI Electronics, LLC, Santa Barbara, Calif.

[21] Appl. No.: 802,177

[22] Filed: Feb. 15, 1997

Related U.S. Application Data

[63] Continuation of Ser. No. 583,604, Jan. 5, 1996, abandoned.

[51] Int. Cl.$^6$ .............. H03B 5/12; H03C 3/14; H03C 3/22; H03D 3/00
[52] U.S. Cl. ............ 332/123; 329/324; 331/117 R; 331/177 R; 331/177 V; 332/135; 332/136
[58] Field of Search ............ 332/117, 123, 332/135, 136; 331/117 R, 117 FE, 177 R, 177 V; 329/324

[56] References Cited

U.S. PATENT DOCUMENTS

| | | | |
|---|---|---|---|
| 3,611,195 | 10/1971 | Parham | 332/135 |
| 4,071,832 | 1/1978 | Cloke | 331/117 R |
| 5,245,298 | 9/1993 | Pham | 331/74 |

*Primary Examiner*—Siegfried H. Grimm
*Attorney, Agent, or Firm*—Edgar W. Averill, Jr.

[57] ABSTRACT

The high frequency circuit includes an oscillator connected in a Colpitts configuration. Negative feedback to the oscillator is applied through an amplifier, both to stabilize the circuit and to permit frequency modulation of the carrier signal generated by the circuit. This feedback incorporates a capacitance to neutralize the Miller effect, thereby enabling it to operate at exceedingly high carrier frequencies. A variation of the circuit permits it to be simultaneously controlled by both a voltage and a current control signal. Also, by applying a frequency modulated carrier signal at a particular node of the oscillator, a demodulated output signal may be obtained.

25 Claims, 5 Drawing Sheets

HIGH FREQUENCY OSCILLATOR CIRCUITS OPERABLE AS FREQUENCY MODULATORS AND DEMODULATORS

This application is a continuation of application Ser. No. 08/583,604, filed Jan. 5, 1996, now abandoned.

BACKGROUND OF THE INVENTION

The present invention relates to certain high frequency oscillator circuits, particularly circuits capable of operating at exceedingly high frequencies to generate an exceedingly wide band of frequency modulated signal or to accept such a signal and generate a demodulated signal.

As greater use is made by broadcasters of the electromagnetic spectrum, it is necessary to develop circuitry capable of generating exceedingly high frequencies, and also of modulating a generated high frequency carrier signal thereby to convey information on the modulated carrier. Significant challenges are presented by these requirements. Sophisticated electronic components must be used, and the subtle effects exhibited by these components at exceedingly high frequencies must be taken into account. For example, the "Variable Frequency Oscillator and Modulator Circuits Including Colpitts Transistor and Feedback Transistor" disclosed in my U.S. Pat. No. 3,611,195 dated Oct. 5, 1971 relates to oscillator and modulator circuits capable of megahertz ($10^6$) frequency operation, but of limited to no usefulness at gigahertz ($10^9$) frequencies.

A gigahertz oscillator circuit capable of generating a modulated signal would find significant application. The broadcast spectrum at gigahertz frequencies is not nearly as crowded as at lower frequencies. Also, if it were possible to frequency modulate a gigahertz carrier, at least potentially a great deal of information could be conveyed on a broadcast signal of a given gigahertz frequency because of the exceedingly wide bandwidth it offers, at least potentially. With such a circuit, those developing and offering cellular telephones and cellular telephone systems could provide a great many more communication channels for a carrier of a given gigahertz frequency; other significant advantages would also result were it possible to generate and modulate a gigahertz frequency oscillation, particularly if the modulated oscillation was of a wide bandwidth.

An object of the present invention is to provide a high frequency oscillator circuit capable of being modulated and of operating at gigahertz frequencies. Another object of the present invention is to provide a relatively simple, stable high frequency oscillator circuit using semiconductive amplifiers of the same polarity. A third object is to provide such a high frequency oscillator circuit capable of generating a wide frequency modulated bandwidth. A fourth object is to provide a circuit capable of demodulating a frequency modulated gigahertz carrier. These and other objects of the present invention will be apparent to those of ordinary skill in this field from the following description of preferred embodiments of the circuit.

SUMMARY OF THE INVENTION

The high frequency oscillator circuit of the invention includes a first high frequency amplifier with emitter, base and collector electrodes. A first means provides a tuned circuit of a given resonant frequency between the collector and base electrodes of the first amplifier. Second means are provided for appropriately biasing the first amplifier to produce an output signal at the frequency of the tuned circuit. A second high frequency amplifier, with emitter, base and collector electrodes, is attached by a third means to the first amplifier to provide a negative feedback circuit from the collector to the emitter electrode of the first amplifier. Reactive means are attached across the electrodes of the second amplifier to neutralize the Miller effect. Fourth means are provided for applying a modulation signal to the second amplifier to effectively vary the resonant frequency of the first means thereby to provide a frequency modulated oscillator output signal.

Preferably the reactive means is provided by a capacitor attached between the base and collector of the second amplifier. Also, preferably the third means attaches the base of the second amplifier to the collector of the first amplifier and attaches the collector of the second amplifier to the emitter of the first amplifier. Further, preferably the fourth means modulates the base current of the second amplifier thereby to provide a current controlled variable frequency oscillator. In addition, preferably at least the first and second high frequency amplifiers are of the same polarity.

To provide a high frequency demodulator circuit, the circuit described above preferably includes fifth means for generating and applying a frequency modulated carrier frequency to the emitter of the first amplifier thereby to provide a demodulated signal at the second amplifier. A low pass filter circuit may be attached to the second amplifier thereby to provide a replication of the signal applied by the fourth means to frequency modulate the signal applied to the circuit.

Preferably means are also provided to stabilize the bias supplied to both the first amplifier and the second amplifier. Also, preferably variable reactive means are connected to the tuned circuit of the first means to vary the given resonant frequency of the tuned circuit in response to a signal. These variable reactive means preferably are varactor diodes.

BRIEF DESCRIPTION OF THE DRAWINGS

The invention will be further described in connection with the accompanying drawings in which.

DETAILED DESCRIPTION

Figure 1:
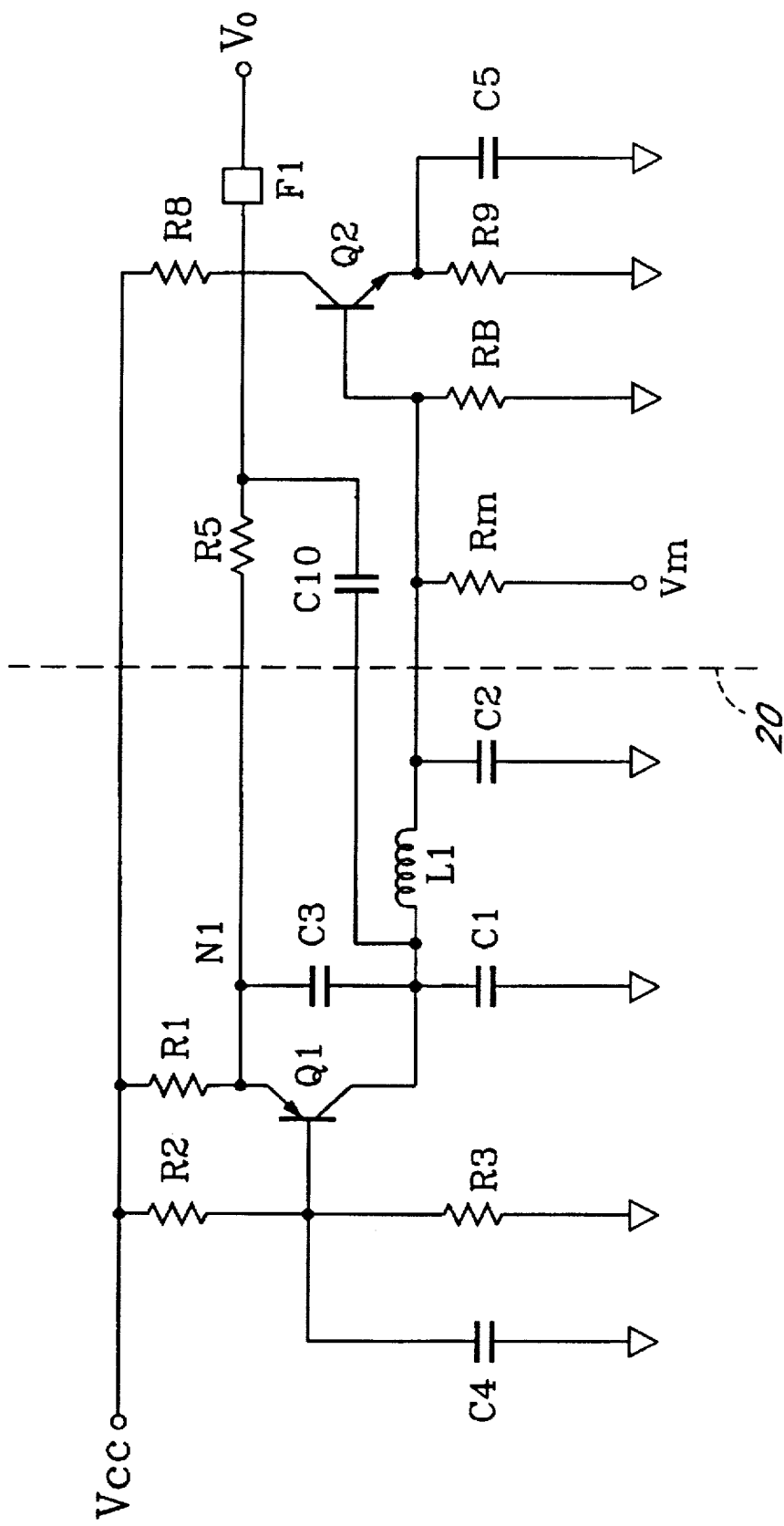
FIG. 1 is a schematic diagram of a first high frequency oscillator circuit constructed in accordance with the present invention.

There are a great many applications for a circuit capable of generating a modulated signal in the gigahertz frequency range, or for demodulating such a signal, or for performing both of these functions. One such circuit is shown in FIG. 1. In a presently preferred embodiment, it employs a PNP transistor Q1 operating as a Colpitts oscillator in a grounded base configuration. The center frequency of operation of this oscillator is determined by the resonance of inductor L1 connected in series with capacitors C1 and C2; this resonant circuit will be referred to as the LC resonant circuit. Base bias from voltage source Vcc is provided by resistors R2 and R3 in a conventional manner. Emitter bias is provided by resistor R1 attached to Vcc. Capacitor C4 grounds the base of Q1. Capacitor C3 provides a high frequency shunt between the collector and emitter of Q1.

To modify the reactance of resonant circuit LC, a second amplifier Q2, preferably of an NPN doping, polarity or configuration (i.e. opposite to that of Q1), modifies the feedback current from the LC resonant circuit through resistor R5 to the emitter of Q1. The current through R5 is a function of the voltage gain of Q2. This gain in turn is the gain of Q2 multiplied by the parallel combination of resistor R8, resistor R5 and capacitance C10. R8 supplies the collect current bias to Q2. C10 is a capacitance of a value equal to the internal capacitance of Q2 between its collector and base, commonly referred to as the Miller effect capacitance or Cb'c. Thus, capacitance C10 neutralizes the Miller effect capacitance which is in parallel with C2 of the LC resonant circuit. Among other things, this stabilizes the high frequency resonance of the LC circuit. To extend the frequency response of the modulated output, the emitter of Q2 is grounded by resistor R9 and capacitance C4. The time constant of R9 and C4 preferably is set to be equal to the R9 Cb'e time constant of Q2.

The Q2 circuit causes the LC resonance circuit to be modified by a phantom inductance, which may be referred to as Lx, in series with L1. Lx is a function of the feedback current through R5 which in turn is a function of the voltage gain of Q2. The gain of Q2, in turn, is a function of the emitter bias current of Q2, which can be changed by applying base current to Q2 through Rm. Thus, by modulating the base current of Q2 with voltage signal Vm, the value of Lx is changed in the LC resonance circuit.

The Colpitts oscillator to the left of phantom line 20, together with the feedback circuit to the right of phantom line 20, forms a variable frequency oscillator (or frequency modulated oscillator) which is current controlled by the base current applied to Q2, which in turn is determined by Vm. The output voltage of the circuit, namely Vo, is a combination of the oscillator frequency or carrier frequency (Fc) determined by the LC resonance circuit, plus harmonics of Fc, plus the modulation frequency of Vm. Put differently, the frequency Fc at Vo is a frequency modulated carrier with a base band modulation of Vm frequencies.

It is possible to employ the circuit shown in FIG. 1 to demodulate a frequency modulated signal. Specifically, if a carrier current Fc of a frequency modulated signal is injected into the circuit at the emitter of Q1, such as at node N1 then the oscillator Q1 will lock to the frequency of the carrier. This locking of the oscillator causes the frequency of the carrier to appear at output Vo as well as all frequencies of the base band modulation of the frequency modulated carrier applied at node N1. By first passing the output voltage through a low pass filter circuit F1 a demodulated signal will appear at Vo.

The circuit shown in FIG. 1 has many of the characteristics of the circuit shown in the '195 patent. A major improvement of this circuit over the previous circuit is the counteraction of the Miller effect capacitance, or Cb'c, which limits the high frequency operation of the circuit. The present circuit has been satisfactorily operated, both as a modulator and as a demodulator, at gigahertz frequencies.

The circuit shown in FIG. 1 incorporates certain inherent compromises. For example, it effectively applies modulation to the phase lock loop incorporating the LC resonance circuit, which tends to spoil the impedance of this loop. This and other compromises of the FIG. 1 circuit are effectively eliminated in the circuit schematically illustrated in FIG. 2. In this circuit, the components whose operation and effect is substantially the same as those shown in the FIG. 1 circuit are identified by similar reference letters and numbers.

Figure 2:
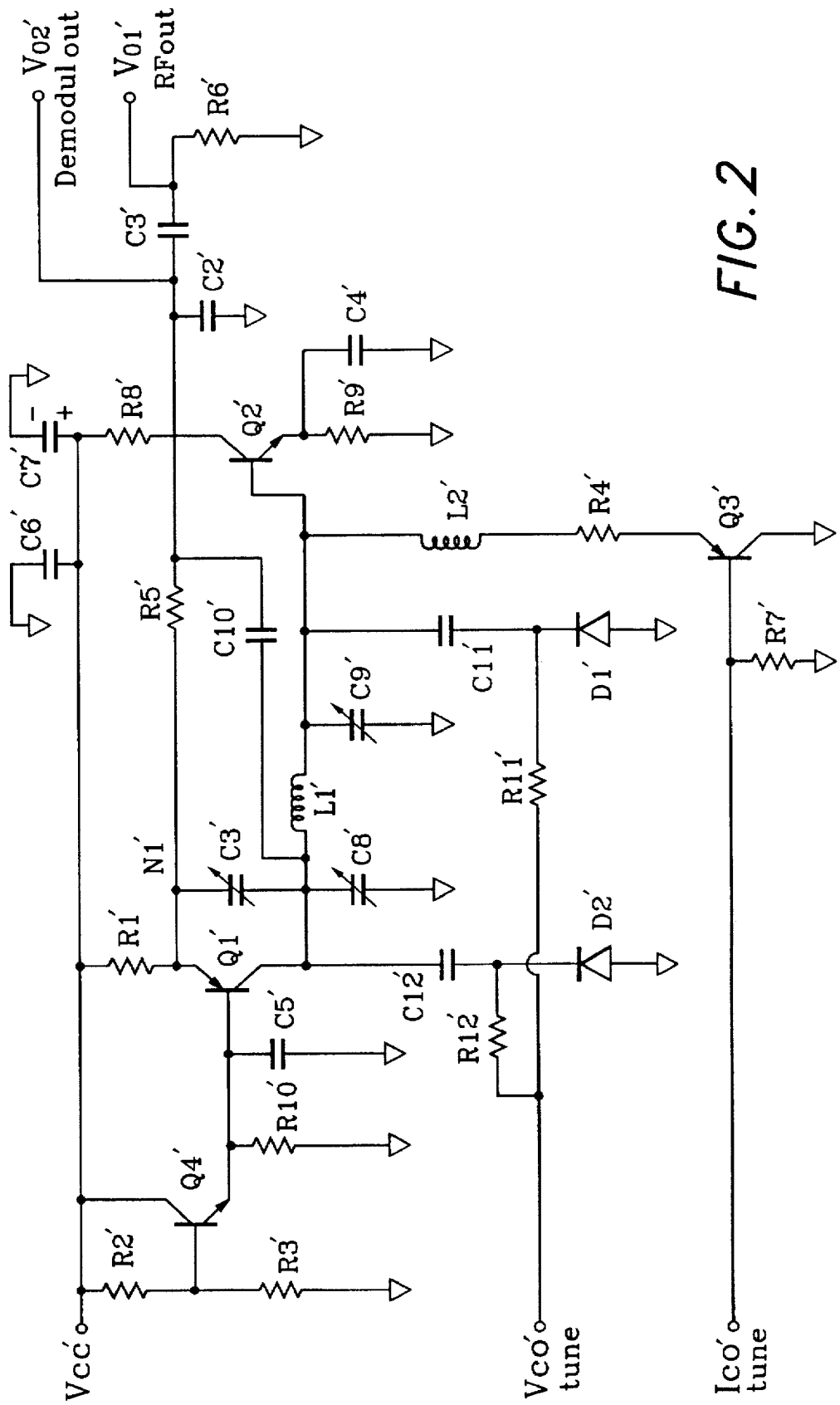
FIG. 2 is a schematic diagram of a second high frequency oscillator circuit constructed in accordance with the present invention.

In general, the FIG. 2 circuit adds to the FIG. 1 circuit a Q3' amplifier circuit to compensate for the voltage drop between the base and emitter of Q2', thereby to regulate the DC emitter current bias of Q2'. It also adds a Q4' circuit to compensate for the base to emitter voltage drop of Q1' to regulate the DC emitter current bias of Q1'. Further, it adds certain circuit elements to make the circuit a dual frequency controlled oscillator for both an applied voltage VCO' and an applied current ICO'. This dual control provision is a significant improvement in variable frequency oscillator circuits.

More particularly, the circuit of FIG. 2 incorporates an amplifier Q3' which connects the base of Q2' to ground through an inductor L2' and a resistor R4' in series with the emitter and collector of Q3'. Thus, by applying a current ICO' to the base of Q3', grounded by resistor R7', it is possible to effectively regulate the DC emitter-collector current through Q3', thereby effecting the feedback current to Q1' through resistor R5' and the frequency modulated output of the circuit.

Amplifier Q4' compensates for the base to emitter voltage drop of Q1' by connecting Q4' across the bias resistor network R2'–R3' to apply the emitter output of Q4' to resistor R10' and the base of Q1'. This effectively regulates the DC emitter current bias of Q1'.

A prototype of the circuit shown in FIG. 2 has been constructed and appears, from preliminary tests, to perform satisfactorily in the gigahertz frequency range, generating a carrier frequency signal Fc of approximately 1.5 GHz and is capable of a frequency modulation of at least 500 MHz. This circuit incorporated the following components:

| R1' - 220 ohm | C1' - 1 μμf |
|---|---|
| R2' - 4.7KΩ | C2' - 2 μμf |
| R3' - 6.8KΩ | C3' - 33 μμf |
| R4' - 50 ohm | C4' - 5 μμf |
| R5' - 680 ohm | C5' - .001 μf |
| R6' - 150 ohm | C6' - .001 μf |
| R7' - 100 ohm | C7' - 4.8 μf |
| R8' - 220 ohm | C8' - (.5 to 5) μμf |
| R9' - 39 ohm | C9' - (.5 to 5) μμf |
| R10' - 2.2KΩ | C10' - 1 μμf |
| R11' - 10KΩ | C11' - 2 μμf |
| R12' - 10KΩ | C12' - 2 μμf |
| R13' - 150 ohm | C13' - 5 μμf |
| | C14' - 5 μμf |
| D1' - 2.8 μμf at −2.0 volts | |
| D2' - 2.8 μμf at −2.0 volts | |
| Q1' - NE88933 (NEC ELECTRONICS) | |
| Q2' - NE85619 (NEC ELECTRONICS) | |
| Q3' - 2N2907 | |
| Q4' - 2N2222 | |
| L1' - .0025 μH (4 .01 μH in parallel) | |
| L2' - .01 μh | |

To tune the carrier frequency of the FIG. 2 LC circuit, a control voltage VCO' is applied through resistors R11' and R12' connected in series with capacitors C11' and C12' to opposite ends of the LC resonance circuit (inductor L1' and capacitors C8' and C9'). Capacitors C8' and C9' may be variable capacitors to permit gross tuning of the carrier frequency Fc. Varactor diodes D1' and D2' connect the common points between these RC circuits to ground. Thus, the diode capacitances of D1' and D2' plus capacitances C8', C9', C11' and C12' as well as L1' (and Lx) in FIG. 2 form the LC resonance circuit discussed with respect to FIG. 1. The various components of this circuit, and in particular the varactor diodes, provide a dual frequency controlled oscillator for both voltage (VCO') and current (ICO') signals. These two signals are isolated from one another in the preferred circuit, and provide effective control over both the carrier frequency Fc and the bandwidth modulation of the frequency modulated output signal. This frequency modulated output signal may be applied through capacitor C3' to grounded resistor R6' to cause the radio frequency output signal to appear at output terminal VO1'. By applying a frequency modulated carrier frequency Fc signal to node N1', as previously described, a demodulated output signal will appear at output VO2" connected to the common terminal between capacitors C2' and C3'. The circuit of FIG. 2 effectively eliminates the problems resulting from modulating a frequency or carrier signal generated by an oscillator by varying (or spoiling) the impedance of the oscillator's LC resonance circuit and the phase lock loop incorporating it.

Figure 3:
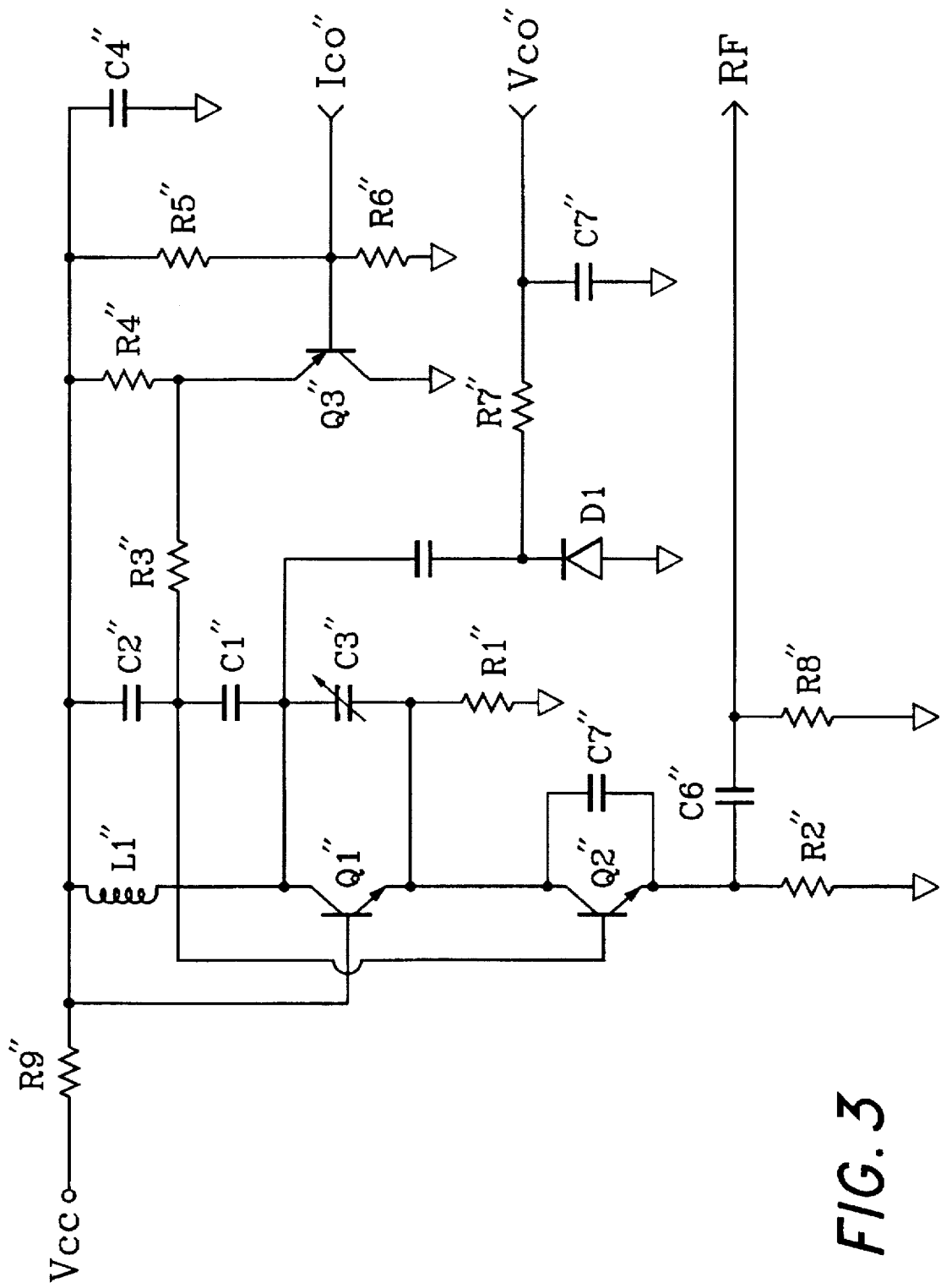
FIG. 3 is a schematic diagram of a third high frequency oscillator circuit constructed in accordance with the present invention.

The circuits of FIG. 1 and FIG. 2 both include NPN polarity as well as PNP polarity semiconductors. Currently NPN semiconductors are available with characteristics which permit their operation in a range above 10 GHz, whereas PNP semiconductors are significantly more limited in their high frequency capabilities. It would be desirable to provide a high frequency oscillator circuit that employs only NPN semiconductors as both the Q1 and Q2 transistors, which would also facilitate production of the circuit as an integrated circuit. Such a circuit is schematically illustrated in FIG. 3. In it, both transistors Q1" and Q2" are NPN semiconductors. Q1", and its connected components, provides an oscillator operating in a grounded base configuration. The center frequency of the oscillator is determined by the resonance of L1" in series with C1" and C2"; as in the previous circuits, these components provide and define the LC resonant circuit.

Q2" provides an emitter amplifier forming a closed loop negative feedback circuit from the collector of Q1" through the emitter of Q1". Capacitor C7" neutralizes the Miller effect capacitance of Q2". Whereas in the circuit of FIG. 1 the Q2" amplifier introduced a phantom inductance in series with L1, here the Q2" amplifier introduces a phantom inductance, Lx, in parallel with L1". The phantom inductance, Lx, is a function of the feedback current from the collector of Q2". Being in parallel with L1", it causes the resonant circuit to operate at a higher frequency (whereas in the previous circuit being in series with L1, Lx caused the resonant circuit to operate at a lower frequency). Operating at a higher frequency is in many applications a significant and desirable characteristic. With this exception, the elements of the FIG. 3 circuit function in much the same manner as those of the FIG. 1 circuit for the Q1 and Q2 semiconductors.

The carrier frequency, Fc, of the FIG. 3 circuit is determined in part by the LC resonant circuit and in part by the feedback applied by Q2" to Q1". This feedback is a function of the emitter voltage or current through R2". Q3" stabilizes this frequency by stabilizing the emitter current of Q2". Put differently, changing the emitter current of Q2" will cause the center frequency of the oscillator incorporating Q1" to change. The frequency of the oscillator can be frequency modulated by changing the emitter current of Q2". This in turn can be achieved by applying a modulating frequency ICO" to the base of Q3".

Varactor diodes exhibit a change in capacitance as a result of a change in bias voltage. Such a diode is connected across the LC resonant circuit in a manner similar to that of FIG. 2, permitting a voltage VCO" to be applied through resistor R7" to reverse bias diode D1", thereby causing the center frequency of of the Q1" oscillator to change. This permits the center frequency of the oscillator to be voltage controlled while at the same time allowing it to be frequency modulated by ICO". Thus, the FIG. 3 circuit provides both a voltage controlled oscillator and a current controlled oscillator. The output signal RF may be taken from the emitter of Q2" across resistor R8".

A prototype of the circuit shown in FIG. 3 has been constructed and appears, from preliminary tests, to perform satisfactorily in the gigahertz frequency range, generating a carrier frequency signal, Fc, of approximately 2 GHz and a frequency modulation of at least 400 MHz. This circuit incorporated the following components:

| | |
|---|---|
| R1" - 1K ohm | C1" - 2.0 μμf |
| R2" - 470 ohm | C2" - 3.0 μμf |
| R3" - 1K ohm | C3" - .9–5 μμf |
| R4" - 3.3K ohm | C4" - .001 μf |
| R5" - 10K ohm | C5" - 2 μμf |
| R6" - 8.2K ohm | C6" - 18 μμf |
| R7" - 3.3K ohm | C7" - 1 μμf |
| R8" - 1K ohm | |
| Q1" - MPS 901 or equiv. | D1" - .01 μh |
| Q2" - MPS 901 or equiv. | |
| Q3" - 2N2907 | |

Initially, the FIG. 3 circuit was tested without the C7" capacitance and exhibited various problems, not the least of which was that it was quite noisy. The Miller effect neutralizing capacitance C7" solved many of the problems, not the least of which, in addition to the effects of such a capacitance as previously discussed, was that it significantly reduced the noise of the circuit. The size of C7" should match the Cb'c of Q2". Thus, depending upon the semiconductor selected as Q2", the value of C7" very likely will change.

Among the difficulties presented by the FIG. 3 circuit are some related to the nature of the LC tank circuit formed by L1", C1" and C2". This is not a true π circuit. The circuit could have been designed such that it was a true π circuit, with the common connection between the capacitance being grounded, but that would present a biasing problem. Another problem with this circuit is the difficulty it presents in attempting to shift the center frequency Fc with the diode D1". This may well have been related to the fact that the tank circuit was not a true π circuit. Various ways to resolve this problem will be apparent to those of ordinary skill in this field, including, for example, dividing L1" and providing a choke.

Figure 4:
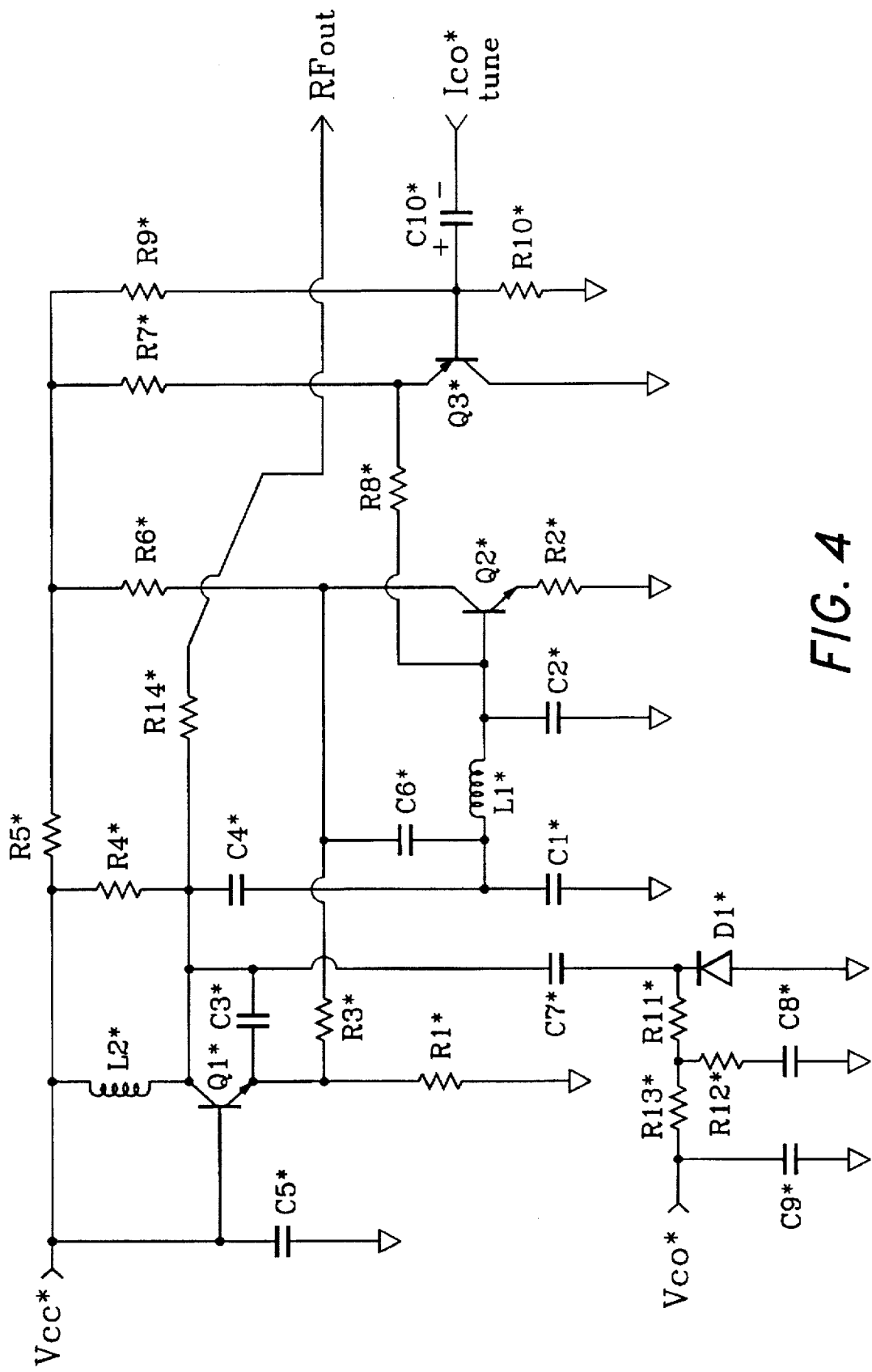
FIG. 4 is a schematic diagram of a fourth high frequency oscillator circuit constructed in accordance with the present invention.

Another circuit that uses high frequency semiconductors of the same polarity as Q1 and Q2, and which exhibits significant advantages, is shown in FIG. 4. In it capacitor C6* is effectively hooked between the base and collector of Q2* to neutralize its Miller effect capacitance. The tank circuit L1*, C1* and C2* is connected between the base of Q2* and the collector of Q1*. Feedback from Q2* is provided through resister R3* to the emitter of Q1*. The control voltage through VCO* is supplied to Q1* through C7*. The RF output of the circuit is also taken from the collector of Q1*, resistor R14* decoupling the output from the circuit. The semiconductor Q3* compensates for the base to emitter diode effect of Q2* over a temperature range, controlling the current in Q2* and thereby stabilizing the circuit.

The operation of the FIG. 4 circuit is similar in significant respects to the operation of the previous circuits. To understand what appears to be the case, it is necessary to consider the phases of the currents and voltages in the LC tank circuit. The voltages through the inductor L1* and through the capacitor C1* and C2* all appear to be in phase. However, the currents in the tank circuit elements are in quadrature. The voltage in C2* lags the current in C2* which results in the current at the collector of Q2* being in quadrature with the current at its base. This is fed back to L1* through C6* and reinforces the current through L1*. The effect in the FIG. 4 circuit appears to be that the phantom inductance, Lx, is in parallel with inductor L1*, rather than being in series with it. This means that it tends to increase the frequency of the tank circuit. If both Q1* and Q2* are gallium arsenide NPN semiconductive elements, it is possible to obtain such components currently that are capable of operating at 18 GHz. Using them, if the frequency Fc of FIG. 4 circuit is set to be approximately 9 GHz, the effect of the phantom inductance feedback, Lx will be to increase the output frequency of the circuit. It is possible to increase this output frequency to a point where it is twice, or even more than twice, the carrier frequency FC. It may well be that both semiconductors Q1* and Q2* could be two FETs and obtain substantially the same result.

It is necessary to control the voltage through Q2* to avoid saturation. This is the primary purpose of resistor R6*. The magnitude of the phantom inductance Lx will depend to a significant degree on the voltage swing appearing across R3*. It appears to be possible, using the circuit of FIG. 4, to disconnect R6* from Vcc and to modulate the power source applied to Q2* through R6* thereby to modulate Fc.

Another interesting effect of the FIG. 4 circuit is that its power output can be changed or adjusted by changing R1* and R3*. The ratio of these two resistors should remain the same. If they are adjusted to increase the emitter current through Q1* the power output offered at the collector of Q1* through R14* will increase. In this fashion it is possible with the circuit of FIG. 4 to adjust the power output to match the power requirements of other components of the system. When this circuit is used as an oscillator and modulator of a portable electronic device, such as a cellular telephone for example, because this circuit does not operate Q1* at a higher power output level than is necessary, it conserves battery power which can be an important advantage in extending the useable life of such a portable circuit for a given battery charge.

The FIG. 4 circuit also has been constructed and tested and appears to work satisfactorily. The values of the components were as shown below:

| | |
|---|---|
| R1* - 910 ohm | C1* - 2 μμf |
| R2* - 68 ohm | C2* - 6 μμf |
| R3* - 1.5K ohm | C3* - 1 μμf |
| R4* - 1K ohm | C4* - 100 μμf |
| R5* - 47 ohm | C5* - .001 μf |
| R6* - 220 ohm | C6* - 1 μμf |
| R7* - 1K ohm | C7* - 4 μμf |
| R8* - 680 ohm | C8* - .022 μf |
| R9* - 22K ohm | C9* - .0022 μf |
| R10* - 2.2K ohm | C10* - 1 μf |
| R11* - 100K ohm | |
| R12* - 8.2K ohm | L1* - .01 μh |
| R13* - 47 ohm | L2* - 2.2 μh |
| R14* - 47 ohm | |
| D1* - 1N5441C (6.8 μμf) | |
| Q1* - MPS 901 or equiv. | |
| Q2* - MPS 901 or equiv. | |
| Q3* - 2N2907 | |

With these elements and values, the carrier frequency Fc was in the 500–600 MHz range. The phantom inductance feedback permitted this frequency to be increased to more than double Fc, specifically to the range of approximately 1.1 GHz. In other words, it more than doubled the Fc. When the Q1* and Q2*GaAs components are employed it may have an exceedingly high frequency capability, such as 18 GHz; thus, it appears that an Fc of 9 GHz is possible with a modulation range up to 18 GHz.

The FIG. 4 circuit provides an improved center frequency stability. It also provides a means for improving the power usage of the circuit, and the power output match to associated components. Further, being controlled by ICO it is not sensitive to external fields. For example, waving a hand near the circuit has little if any effect on the circuit.

Figure 5:
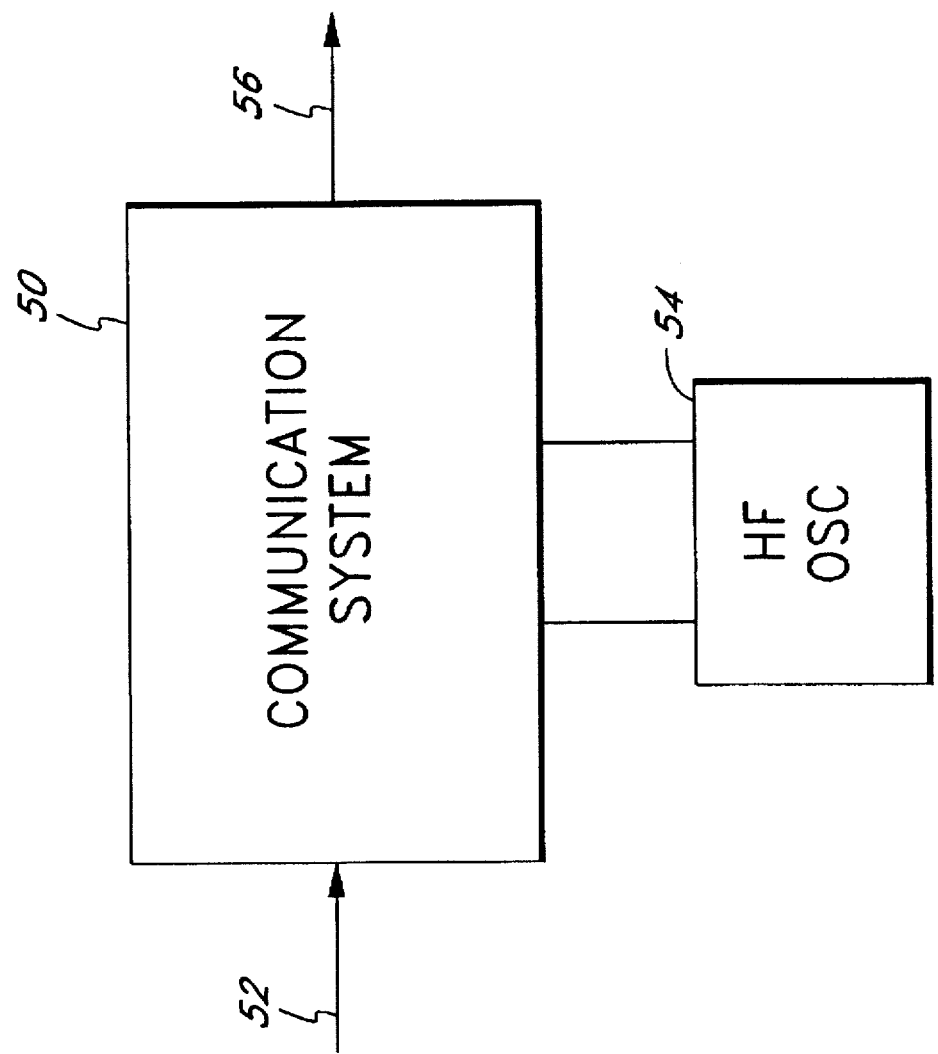
FIG. 5 is a block diagram of a communication system incorporating a high frequency oscillator circuit of the present invention.

The high frequency oscillator circuits of FIGS. 1, 2, 3 or 4 may be advantageously employed in any of various communication systems. For example, it may be used in a cellular telephone communication system to generate a gigahertz carrier frequency and to produce a frequency modulated output signal. Or it may be used in a fiber optic communication system to generate a frequency modulated carrier signal. Or it may be used in either of such communication systems to accept a frequency modulated gigahertz carrier signal and to produce a demodulated output signal. Such a system is shown in FIG. 5, in which the communication system 50 may include as an input 52 either a frequency modulated gigahertz carrier signal or a signal to be employed in generating a frequency modulated gigahertz carrier signal. The high frequency oscillator 54 may be one of the circuits as shown in FIGS. 1, 2, 3 or 4, or a circuit incorporating the characteristics of any of those circuits but modified to suit the circuit preferences of the designer. The output 56 of the system, when the input is a modulation signal, will be a frequency modulated gigahertz carrier signal, or when the frequency is a frequency modulated gigahertz carrier signal, the output will be a demodulated signal.

Constant current control of Q1* is provided by inductor L2* between the collector of Q1* and the Vcc* power supply. The resistor R4* swamps out the effect of L2* on the tank circuit and to the capacitances of the circuit. The DC emitter current of Q1* is stabilized by L2* to provide a stiffer drive to the LC resonant circuit or tank circuit. The resistor and capacitor elements between VCO* and the varactor diode D1* provide a low pass filter for the voltage control input to the circuit.

Various modifications in the foregoing circuits may be made, and will be apparent to those of ordinary skill in this field. For that reason, the invention is not limited to the specific circuits shown and described, but rather is as set forth in the following claims.

I claim:

1. A high frequency oscillator circuit including:

a first high frequency amplifier with emitter, base and collector electrodes;

first means providing a tuned circuit of a given resonance frequency between the collector and base of the first amplifier;

second means for applying biasing potentials to the first amplifier to produce an output signal at the frequency of the tuned circuit;

a second high frequency amplifier with emitter, base and collector electrodes;

third means attaching the second amplifier to the first amplifier to provide negative feedback from the collector to the emitter of the first amplifier;

capacitor means attached across the electrodes of the second amplifier to neutralize the Miller effect; and fourth means for applying a modulation signal to the second amplifier to effectively vary the resonant frequency of the first means, thereby to provide a frequency modulated output signal.

2. A high frequency oscillator circuit as set forth in claim 1 in which the fourth means modulates the base current of the second amplifier thereby to provide a current controlled variable frequency oscillator.

3. A high frequency oscillator circuit as set forth in claim 1 in which the third means attaches the base of the second amplifier means to the collector of the first amplifier means and attaches the collector of the second amplifier means to the emitter of the first amplifier means, the capacitor means being attached between the base and collector of the second amplifier.

4. A high frequency oscillator circuit as set forth in claim 3 in which the first amplifier and first means form a Colpitts oscillator circuit.

5. A high frequency oscillator circuit as set forth in claim 1 including fifth means to stabilize the biasing potential applied to the first amplifier.

6. A high frequency oscillator circuit as set forth in claim 5 in which the fifth means includes a third amplifier means.

7. A high frequency oscillator circuit as set forth in claim 6 in which the third amplifier means is connected between the base and emitter of the second amplifier.

8. A high frequency oscillator circuit as set forth in claim 1 including sixth means to stabilize the bias applied to the second amplifier.

9. A high frequency oscillator circuit as set forth in claim 8 in which the sixth means includes a fourth amplifier means.

10. A high frequency oscillator circuit as set forth in claim 9 in which the fourth amplifier means is connected between the base and the emitter of the second amplifier.

11. A high frequency oscillator circuit as set forth claim 8 and further including fifth means to stabilize the biasing potential supplied to the first amplifier.

12. A high frequency oscillator circuit as set forth in claim 1 including voltage responsive variable reactance means connected to the tuned circuit to vary the given resonance frequency of the tuned circuit in response to a voltage signal.

13. A high frequency oscillator circuit as set forth in claim 12 in which the variable reactance means include at least one varactor diode.

14. A high frequency oscillator circuit as set forth in claim 1 in which the capacitor means attached across the electrodes of the second amplifier induces a phantom inductance in series with the inductance of the first means.

15. A high frequency oscillator circuit as set forth in claim 1 in which the capacitor means attached across the electrodes of the second amplifier introduces a phantom inductance in parallel with the inductance of the first means.

16. A high frequency oscillator circuit as set forth in claim 15 in which the first and second amplifiers are of the same polarities.

17. A communication system including a high frequency oscillator circuit as set forth in claim 1.

18. A high frequency oscillator circuit as set forth in claim 1 including a third amplifier connected to the second amplifier to stabilize the operation of the second amplifier and to prevent its electrical saturation.

19. A high frequency demodulator circuit for a frequency modulated signal of a given carrier frequency, the circuit including:

a first high frequency amplifier with emitter, base and collector electrodes;

first means providing a tuned circuit of a given resonance frequency between the collector and base of the first amplifier;

second means for applying biasing potentials to the first amplifier to produce a carrier output signal at the frequency of the tuned circuit;

a second high frequency amplifier with emitter, base and collector electrodes;

third means attaching the second amplifier to the first amplifier to provide negative feedback from the collector to the emitter of the first amplifier;

capacitor means attached across the electrodes of the second amplifier to neutralize the Miller effect;

fourth means for applying a modulation signal to the second amplifier to effectively vary the resonant frequency of the first means, thereby to provide a frequency modulated signal; and fifth means for generating and applying a frequency modulated carrier signal to the emitter of the first amplifier thereby to provide a demodulated output signal at the second amplifier.

20. A high frequency demodulator circuit as set forth in claim 19 in which the fourth means modulates the base current of the second amplifier.

21. A high frequency demodulator circuit as set forth in claim 19 in which the third means attaches the base of the second amplifier means to the collector of the first amplifier means and attaches the collector of the second amplifier means to the emitter of the first amplifier means, and in which the capacitor means is attached between the base and collector of the second amplifier.

22. A high frequency demodulator circuit as set forth in claim 19 in which the first amplifier and first means form a Colpitts oscillator circuit.

23. A high frequency demodulator circuit as set forth in claim 19 including a low pass filter circuit, and sixth means applying the demodulated output signal at the second amplifier to the low pass filter circuit thereby to provide a filtered demodulated signal at the output of the low pass filter circuit.

24. A high frequency demodulator circuit as set forth in claim 19 in which the first and second amplifiers are of the same polarity.

25. A communication system including a high frequency demodulator circuit as set forth in claim 19.

* * * * *